US008102237B2

(12) United States Patent
Espino

(10) Patent No.: US 8,102,237 B2
(45) Date of Patent: Jan. 24, 2012

(54) LOW PROFILE COIL-WOUND BOBBIN

(75) Inventor: Marvin C. Espino, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 580 days.

(21) Appl. No.: 12/138,119

(22) Filed: Jun. 12, 2008

(65) Prior Publication Data

US 2009/0309686 A1 Dec. 17, 2009

(51) Int. Cl.
*H01F 27/30* (2006.01)

(52) U.S. Cl. .......... 336/208; 336/65; 336/185; 336/192; 336/199

(58) Field of Classification Search .................. 336/182, 336/185, 199, 208, 65, 192
See application file for complete search history.

(56) References Cited

U.S. PATENT DOCUMENTS 2,912,481 A * 11/1959 Backus et al. ................ 336/192
4,047,061 A * 9/1977 Kilmer et al. ................. 310/164
4,939,623 A * 7/1990 Equi et al. ..................... 361/752
5,010,314 A 4/1991 Estrov
5,175,525 A 12/1992 Smith
5,307,041 A * 4/1994 Kato et al. ...................... 336/83
5,345,670 A * 9/1994 Pitzele et al. ................... 29/606
5,359,313 A * 10/1994 Watanabe et al. ............. 336/178
5,521,762 A * 5/1996 Tomiyama et al. ........... 359/814
5,760,669 A 6/1998 Dangler et al.
5,977,855 A * 11/1999 Matsumura et al. ............ 336/96
6,008,993 A * 12/1999 Kreft ............................ 361/737
6,285,272 B1 * 9/2001 Boytor et al. .................. 336/83
6,587,026 B2 * 7/2003 Yeh et al. ...................... 336/223
6,727,793 B2 * 4/2004 Piechnick ..................... 336/198
6,876,555 B2 * 4/2005 Matsumoto et al. .......... 361/782
6,909,609 B1 6/2005 Piechnick
6,914,506 B2 7/2005 Gallup et al.
6,970,065 B2 * 11/2005 Sakai et al. ................... 336/208
7,218,198 B2 * 5/2007 Pilniak et al. ................. 336/208
7,378,932 B1 * 5/2008 Crow et al. ................... 336/208
7,598,837 B2 * 10/2009 Gilmartin et al. ............. 336/192
7,646,276 B2 * 1/2010 Yang et al. ...................... 336/83

* cited by examiner

*Primary Examiner* — Anh T. Mai
*Assistant Examiner* — Joselito Baisa
(74) *Attorney, Agent, or Firm* — Blakey Sokoloff Taylor & Zafman LLP

(57) ABSTRACT

A low profile coil-wound bobbin is disclosed. A low profile coil-wound bobbin includes a spool and a terminal. The spool is configured to have a coil-wire arrangement wound around the spool. The terminals are to be coupled to the coil-wire arrangement and a first side of a circuit board. The terminal is configured to mechanically and/or electrically couple the low profile coil-wound bobbin to the first side of the circuit board such that the low profile bobbin extends through the circuit board to another side of the circuit board.

36 Claims, 8 Drawing Sheets

TOP VIEW

BOTTOM VIEW

SIDE VIEW 5-5

SIDE VIEW

TOP VIEW

BOTTOM VIEW

TOP VIEW

LOW PROFILE COIL-WOUND BOBBIN

TECHNICAL FIELD

This disclosure relates generally to electronic components and in particular but not exclusively, relates to low profile electronic components.

BACKGROUND INFORMATION

Many electrical devices such as cell phones, personal digital assistants (PDA's), laptops, etc. are powered by a source of relatively low-voltage DC power. Because power is generally delivered through a wall outlet as high-voltage AC power, a device typically referred to as a power supply or power converter is required to transform the high-voltage AC power to low-voltage DC power.

Power supplies are typically constructed by mounting electronic components onto a printed circuit board (PCB). One of the electronic components often included in a power supply is a transformer. During operation the transformer allows the transfer of energy between an input side (referred to as a primary side) of the power supply and an output side (referred to as the secondary side) of the power supply. The input and output sides of the transformer are typically galvanically isolated. Galvanic isolation occurs when DC current is unable to flow between the input side and output side of the power supply.

The construction of a transformer may include winding coils of wire around a structure called a bobbin. The bobbin provides support for the coils of wire and may also provide an area for a transformer core to be inserted such that the coils of wire encircle the core. The transformer core defines a path for a magnetic field generated by an electric current flowing through the coils of wire. A coil wound bobbin configuration that uses a bobbin to support the conducting coils may often be made from ordinary wire.

Typically, the physical height of a power supply is limited by the size of the electronic components mounted on the PCB plus a pin protrusion distance (i.e., the distance that the leads of the electronic component protrude past the solder side of the circuit board). Often, the transformer is the tallest component of the power supply. Thus, the minimum height of the power supply may be primarily limited to the height of the transformer plus the additional thickness of the PCB itself plus any additional pin protrusion.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Examples related to low profile coil-wound bobbins are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

In short, embodiments of the present invention include examples of a low profile coil-wound bobbin which may be incorporated into a transformer design to reduce the overall height of a power supply. In one example, the low profile coil-wound bobbin includes terminals to be coupled to a first side of a circuit board. The terminals are configured to couple the low profile coil-wound bobbin to the first side of the circuit board such that the low profile bobbin extends through an opening in the circuit board to another side of the circuit board. Thus, when a transformer incorporating the low profile bobbin of the present invention is coupled to a circuit board, the overall height of the circuit board assembly may only be limited by the height of the transformer and not by the additional thickness of the circuit board itself or by the amount of pin protrusion. Accordingly, the overall height of a circuit board assembly that incorporates the low profile bobbin may be correspondingly reduced. These and other embodiments are described in detail below.

Figure 1:
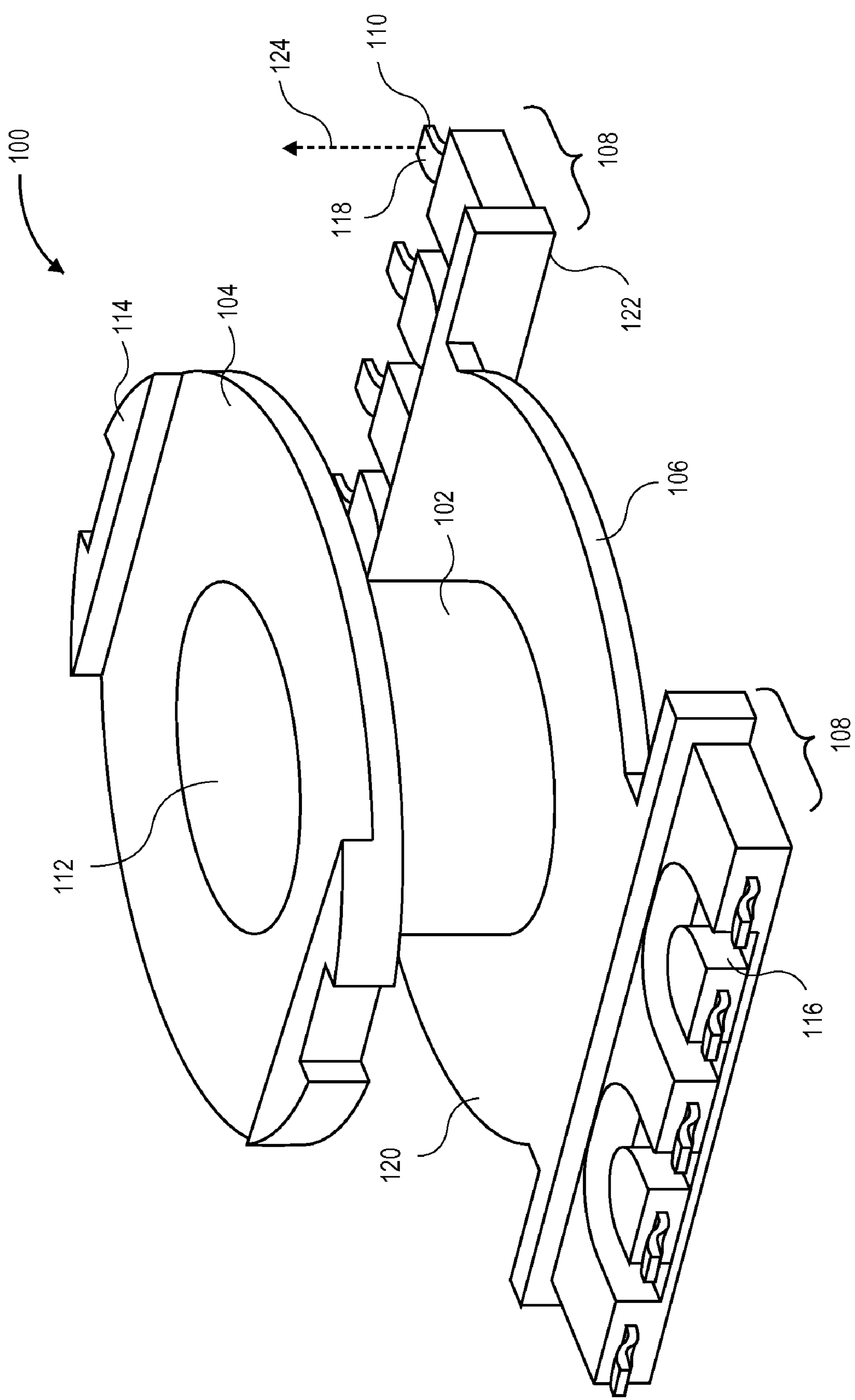
FIG. 1 is a perspective view illustrating a low profile bobbin, in accordance with the teachings of the present invention.

FIG. 1 is a perspective view illustrating a low profile bobbin 100, in accordance with the teachings of the present invention. The illustrated example of low profile bobbin 100 includes a spool 102, an upper flange 104, a lower flange 106, terminal base members 108, terminals 110, and an opening 112. Upper flange 104 is illustrated as including core guides 114 and terminal base member 108 is illustrated as including grooves 116.

As shown in FIG. 1, terminals 110 are mounted to terminal base members 108. In one example terminals 110 are surface mount terminals and include a conductive material, such as metal. Terminal base members 108 may be made from an insulating plastic material and terminals 110 may be molded directly into the side of terminal base members 108. Although FIG. 1 illustrates low profile bobbin 100 as including only ten terminals 110, it is recognized that any number of terminals 110, including one or more, may be utilized depending on the particular application of low profile bobbin 100.

Terminals 110 are to be coupled to a first side of a circuit board by, for example, soldering. Thus, terminals 110 include a mounting surface 118. By way of example, mounting surface 118 may be the surface of terminal 110 that is in closest contact with a mounting pad on the circuit board. As shown in FIG. 1, mounting surface 118 is the upper most surface of terminal 110 and is located between the upper surface 120 of lower flange 106 and a bottom-most surface 122 of low profile bobbin 100. Mounting surface 118 is also shown as facing direction 124 towards upper flange 114. It is in an example configuration such as this that terminals 110 may be configured to couple low profile bobbin 100 to one side of a circuit board such that low profile bobbin 100 extends to another side of the circuit board. Further details of mounting low profile bobbin 100 to a circuit board are provided below with reference to FIGS. 6-9.

Still referring to FIG. 1, spool 102 is configured to have a coil-wire arrangement wound around its circumference. In one example, a coil-wire arrangement includes a primary winding and a secondary winding of a transformer. In one example, the coil-wire arrangement may include any number of primary windings, secondary windings, and/or other windings, such as bias and cancellation windings. In one example the coil-wire arrangement is wound directly onto spool 102. Thus, upper flange 104 and lower flange 106 may be coupled to spool 102 opposite one another to at least partially contain the coil-wire arrangement on spool 102. Also, the upper surface 120 of lower flange 106 may be substantially planar so as to allow the coil-wire arrangement to be wound onto spool 102 without catching on any protrusions.

As shown in FIG. 1, low profile bobbin 100 includes an opening 112 that extends through upper flange 104, spool 102 and lower flange 106. Opening 112 may be configured to receive a core. Thus, opening 112 may cause spool 102 to have an annular cross section (i.e., circular inner and circular outer circumference). Alternatively, spool 102 may have a cross section shaped, such that it has polygonal inner or outer circumferences. For example, a rectangular or other shape may be utilized by spool 102 as its inner or outer shape.

Figure 2:
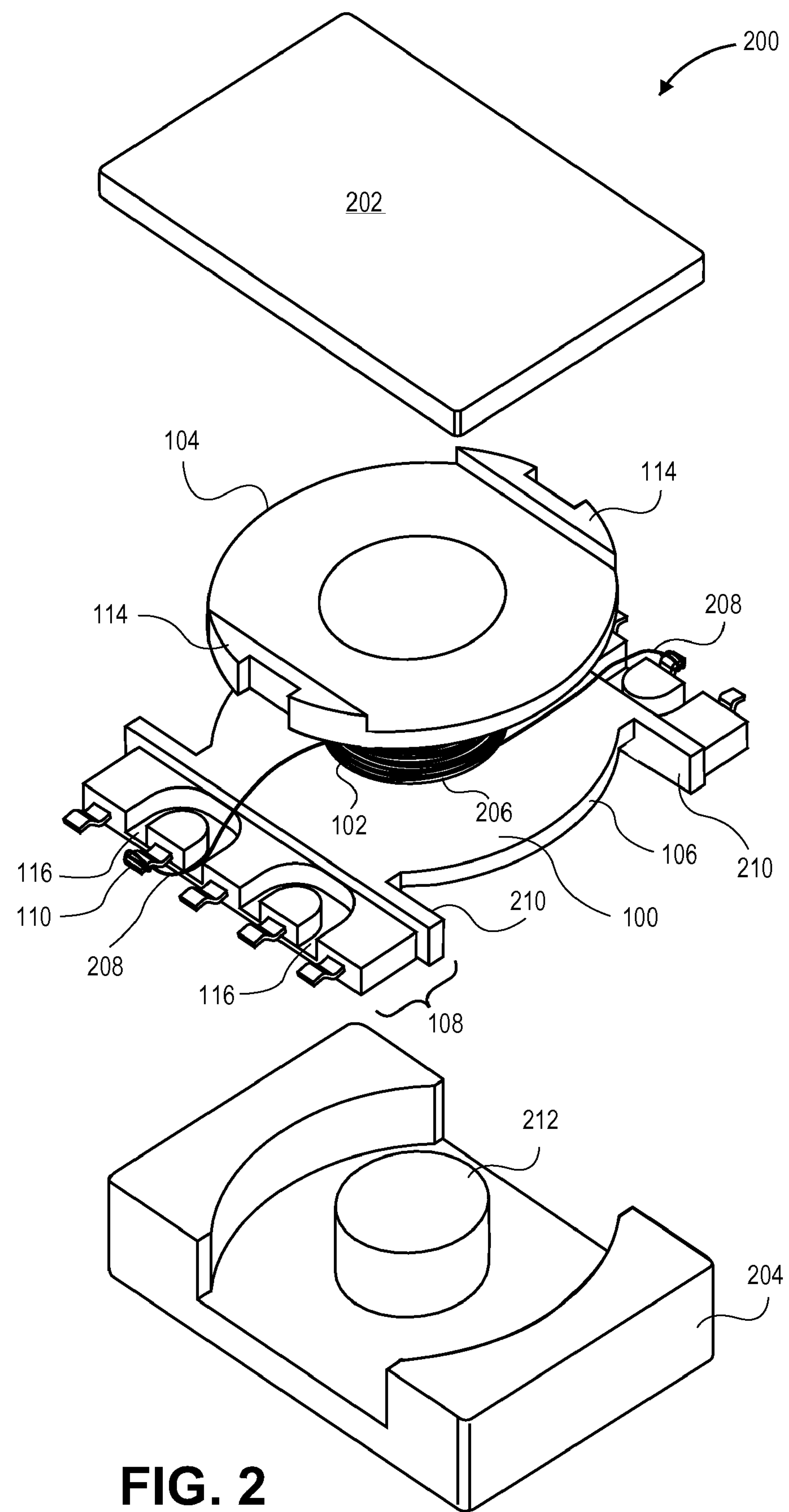
FIG. 2 is an exploded view illustrating a low profile coil-wound bobbin and top and bottom core sections, in accordance with the teachings of the present invention.

FIG. 2 is an exploded view illustrating a low profile coil-wound bobbin 100 including top and bottom core sections 202 and 204, respectively, in accordance with the teachings of the present invention. The illustrated example of bottom core section 204 includes a core 212 and the illustrated example of bobbin 100 includes a coil-wire arrangement 206 having wire ends 208. Low profile coil-wound bobbin 100 including coil-wire arrangement 206, as shown in FIG. 2, is one example of a transformer in accordance with the teachings of the present invention.

As shown in FIG. 2, low profile coil-wound bobbin 100 includes a coil-wire arrangement 206 wound around spool 102. Coil-wire arrangement 206 includes wire ends 208 to be terminated (e.g., electrically coupled) to at least one of the terminals 110. Also, as shown in FIG. 2, terminal base member 108 includes grooves 116. Grooves 116 are configured to allow wire ends 208 to be recessed into terminal base member 108. Thus, when low profile coil-wound bobbin 100 is mounted to a circuit board, wire ends 208 may be routed between the circuit board and low profile coil-wound bobbin 100 such that wire ends 208 are recessed within terminal base member 108.

Upper flange 104 is illustrated as including core guides 114. Core guides 114 are configured to align top core section 202 with upper flange 104. Also, terminal base member 108 includes inside surfaces 210, located beneath lower flange 106. Inside surfaces 210 are configured to align bottom core section 204 with lower flange 106. Top core section 202 and bottom core section 204 may be affixed together (e.g., glued) to enclose low profile coil-wound bobbin 100. In one example, top core section 202, bottom core section 204, and core 212 include a magnetic core material, such as iron-ferrite or core 212 may include other non-magnetic core materials. Although FIG. 2 illustrates core 212 as being included in the bottom core section 204, it is recognized that core 212 may alternatively be included in top core section 202 or even both top and bottom core sections.

Figure 3:
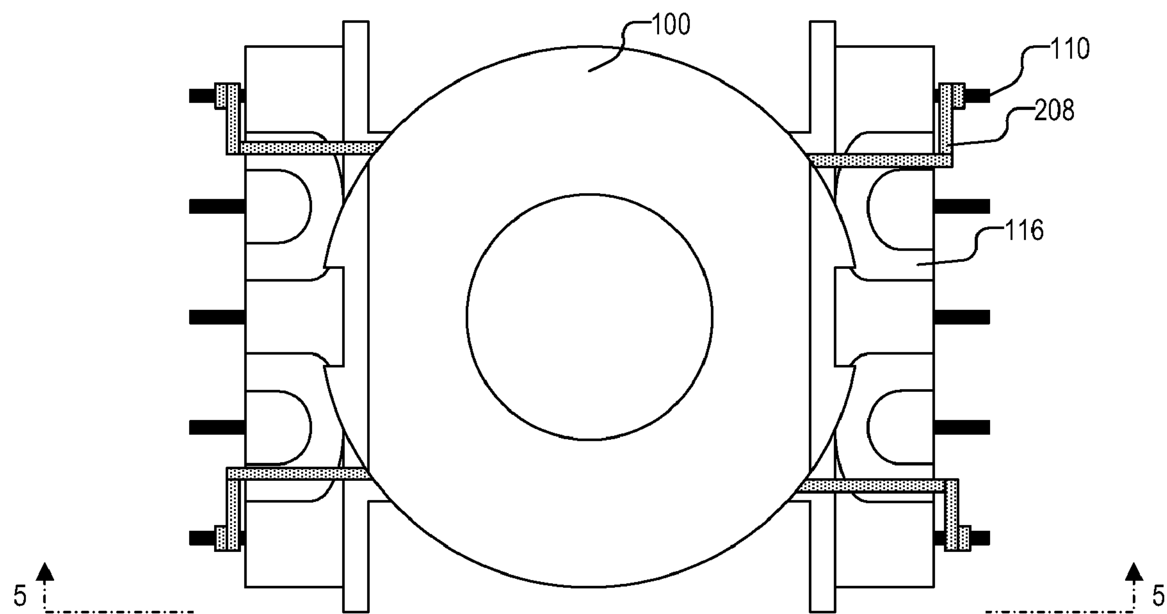
FIG. 3 is a top view illustrating a low profile coil-wound bobbin, in accordance with the teachings of the present invention.
Figure 4:
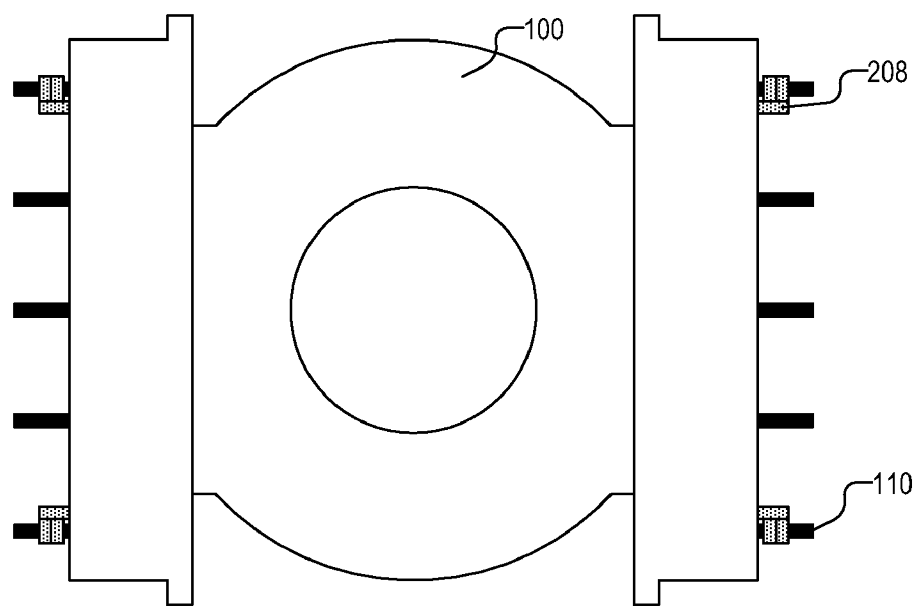
FIG. 4 is a bottom view illustrating a low profile coil-wound bobbin, in accordance with the teachings of the present invention.

FIGS. 3 and 4 are top and bottom views illustrating low profile coil-wound bobbin 100, in accordance with the teachings of the present invention. As shown, wire ends 208 are routed through grooves 116 and are coupled to their respective terminals 110.

Figure 5:
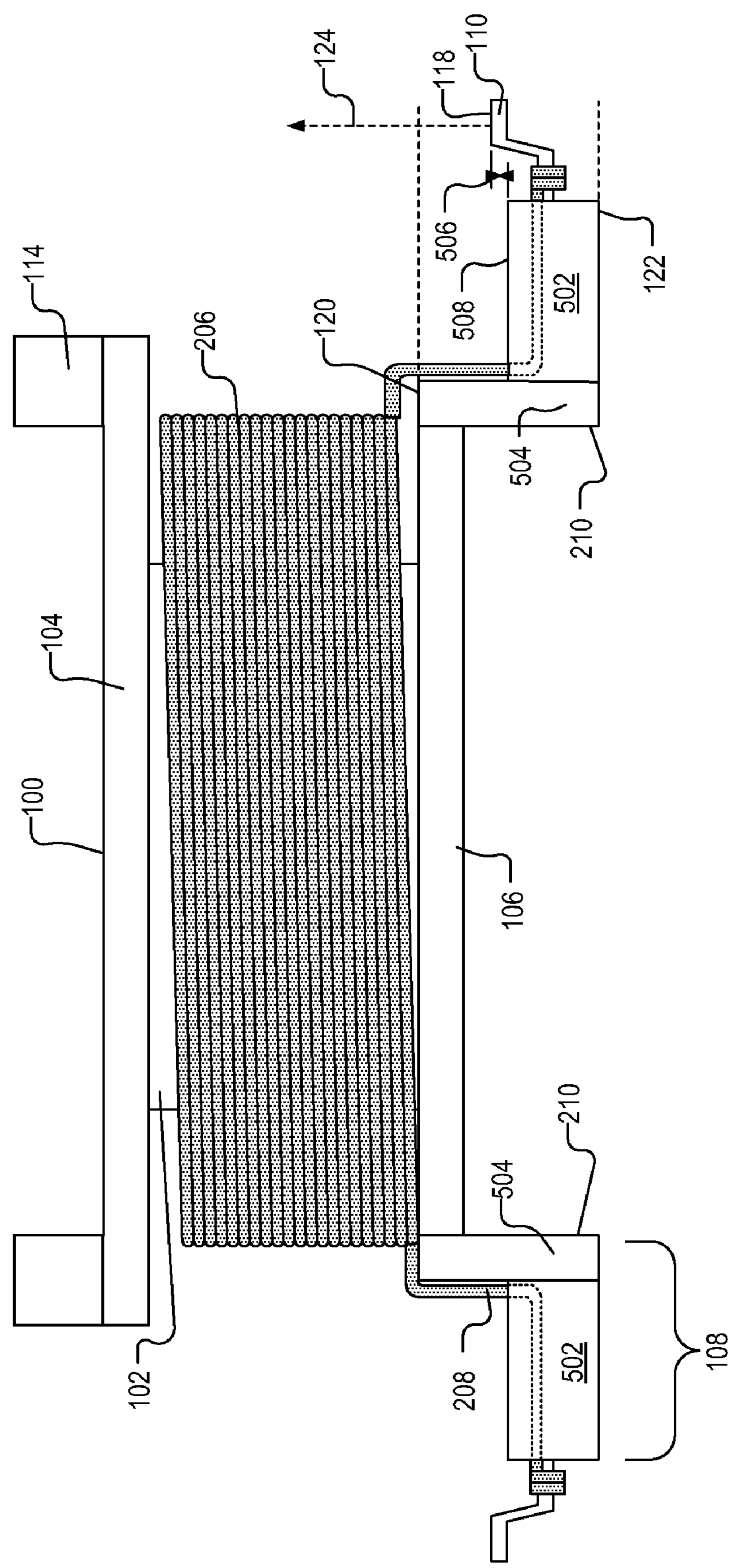
FIG. 5 is a side view illustrating the low profile coil-wound bobbin taken substantially along section lines 5-5 of FIG. 3.

FIG. 5 is a side view illustrating the low profile coil-wound bobbin 100 taken substantially along section lines 5-5 of FIG. 3. The illustrated example of terminal base member 108 includes a horizontal member 502 and a vertical member 504. In one example, horizontal and vertical members 502 and 504 route wire ends 208 along horizontal and vertical paths to provide a total distance between coil-wire arrangement 206 and terminals 110 along the surface of terminal base member 108.

Also shown in FIG. 5 is mounting surface 118 as being located between upper surface 120 and bottom-most surface 122 of low profile coil-wound bobbin 100. Mounting surface 118 is also shown as facing direction 124 towards upper flange 104. In one example, any of horizontal members 502, vertical members 504, and/or terminals 110 may be configured such that mounting surface 118 is located at any point along direction 124. In one example, the location of mounting surface 118 along direction 124 may not cross a threshold plane defined by surface 120, to prevent interference with the winding of coil-wire arrangement 206 around spool 102.

FIG. 5 further illustrates an example clearance distance 506 that may be provided between mounting surface 118 and an upper surface 508 of horizontal member 502. In one example clearance distance 506 is to provide additional clearance when mounted to a circuit board for wire ends 208 to pass between the circuit board and horizontal member 502. In one example clearance distance 506 has a minimum value equal to a diameter of wire ends 208.

Figure 6:
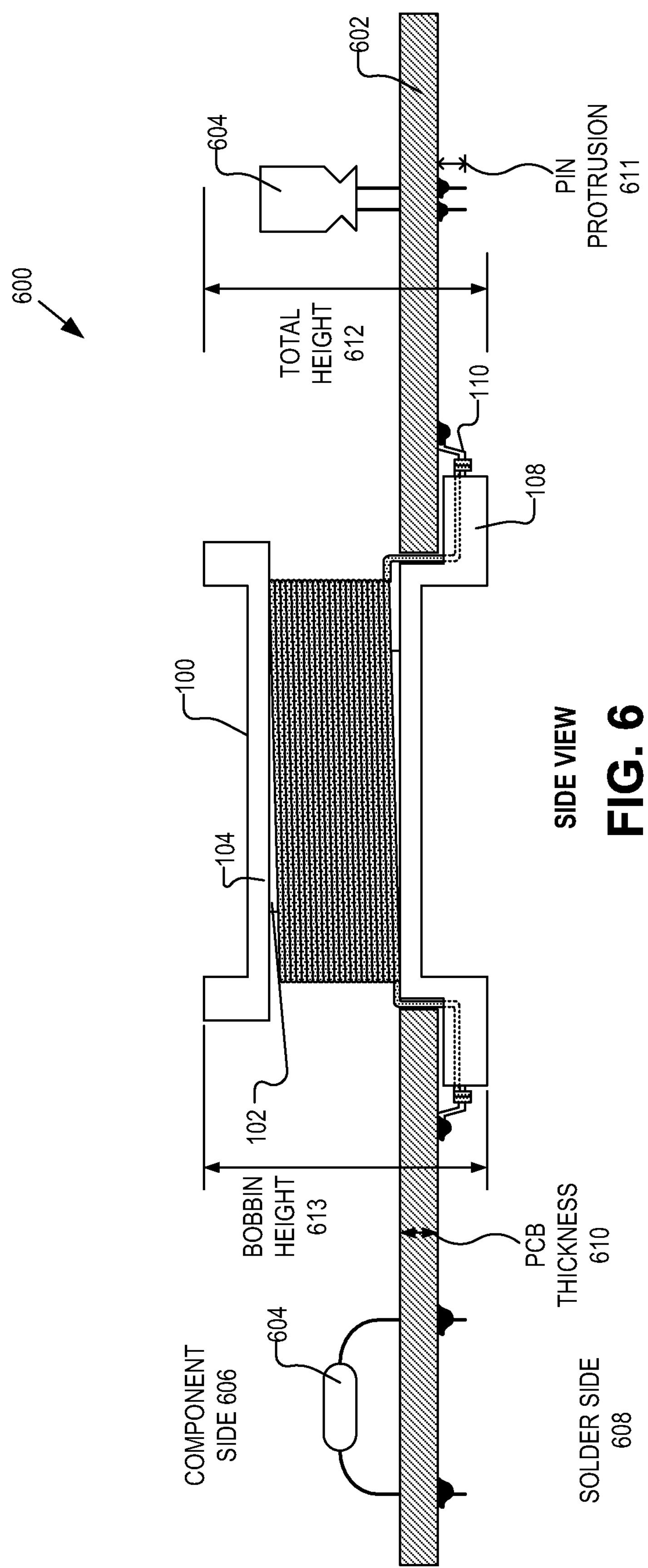
FIG. 6 is a side view illustrating a circuit board assembly including a low profile coil-wound bobbin, in accordance with the teachings of the present invention.

FIG. 6 is a side view illustrating a circuit board assembly 600 including a low profile coil-wound bobbin 100, in accordance with the teachings of the present invention. The illustrated example of circuit board assembly 600 further includes a printed circuit board (PCB) 602 and various through-hole components 604.

As shown, the illustrated example of PCB 602 includes a component side 606 and a solder side 608. In one example, component side 606 is the side of PCB 602 from which through hole components are placed. Solder side 608 may be the side of PCB 602 from which the through-hole components are attached. For example, a through-hole electrical component 604 may be inserted into PCB 602 from component side 606 and electrically coupled to PCB 602 by applying solder on solder side 608. Through-hole components 604 may include a variety of electrical components such as, resistors, inductors, and capacitors. These through hole components 604 may rest on component side 606, while their lead wires are soldered to solder side 608 to create an electrical connection to PCB 602.

As shown in FIG. 6, low profile coil-wound bobbin 100 is coupled to solder side 608 of PCB 602 and extends to the component side 606. Terminals 110 are soldered to solder side 608. In one example, not all terminals 110 are soldered to solder side 608 for electrical coupling. Instead, some terminals 110 may be soldered only for mechanical support, while others may be soldered for both mechanical support and electrical coupling. In another example, some of terminals 110 may be left un-soldered if no mechanical or electrical coupling is needed depending on the particular application.

FIG. 6 further illustrates how PCB thickness 610 and pin protrusion distance 611 do not contribute to a total height 612 of circuit board assembly 600. As shown in FIG. 6, terminal base member 108 is located generally on solder side 608, while spool 102 and upper flange 104 are located on component side 606 of PCB 602. Accordingly, the overall height of a circuit board assembly that incorporates low profile bobbin 100 may be correspondingly reduced. In one example, total height 612 of circuit board assembly 600 is substantially equal to a bobbin height 613 of low profile bobbin 100 without having to add PCB thickness 610 or pin protrusion distance 611 to the total height.

Figure 7:
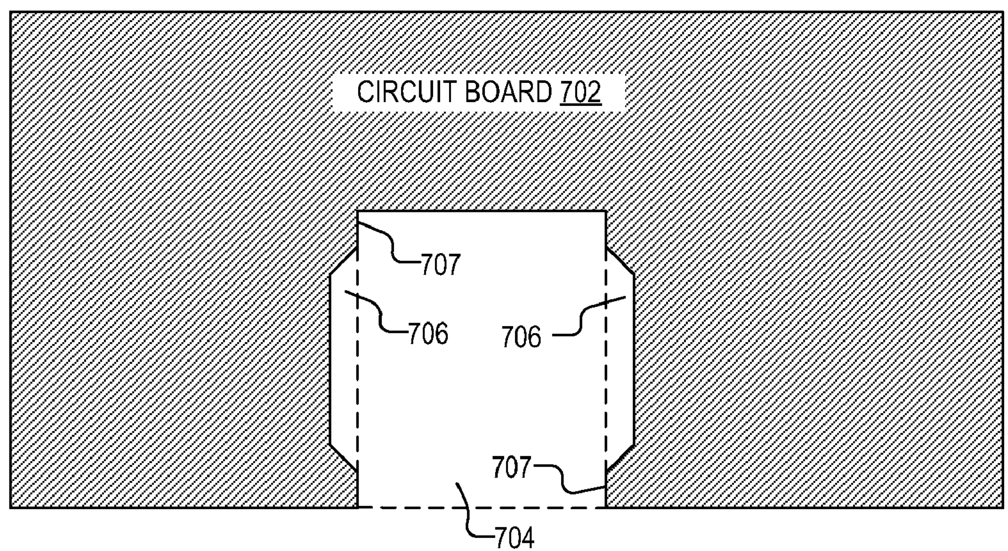
FIG. 7 is a top view illustrating a circuit board for use in a circuit board assembly, in accordance with the teachings of the present invention.
Figure 8:
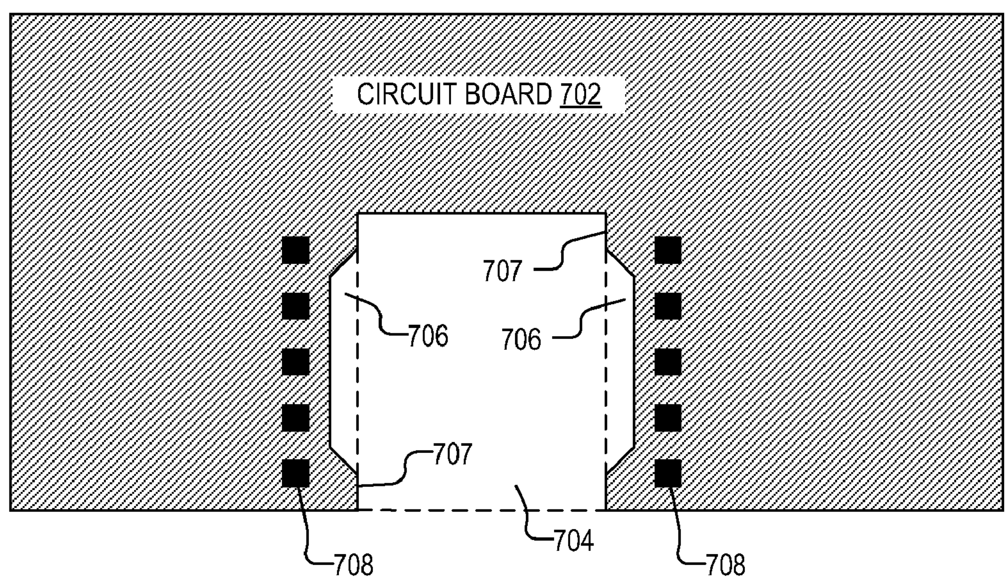
FIG. 8 is a bottom view illustrating a circuit board for use in a circuit board assembly, in accordance with the teachings of the present invention.

FIGS. 7 and 8 are top and bottom views illustrating a circuit board 702 for use in a circuit board assembly, in accordance with the teachings of the present invention. Circuit board 702 is one possible implementation of PCB 602 of FIG. 6. The illustrated example of circuit board 702 includes cutout regions 704 and 706 and solder pads 708.

Figure 9:
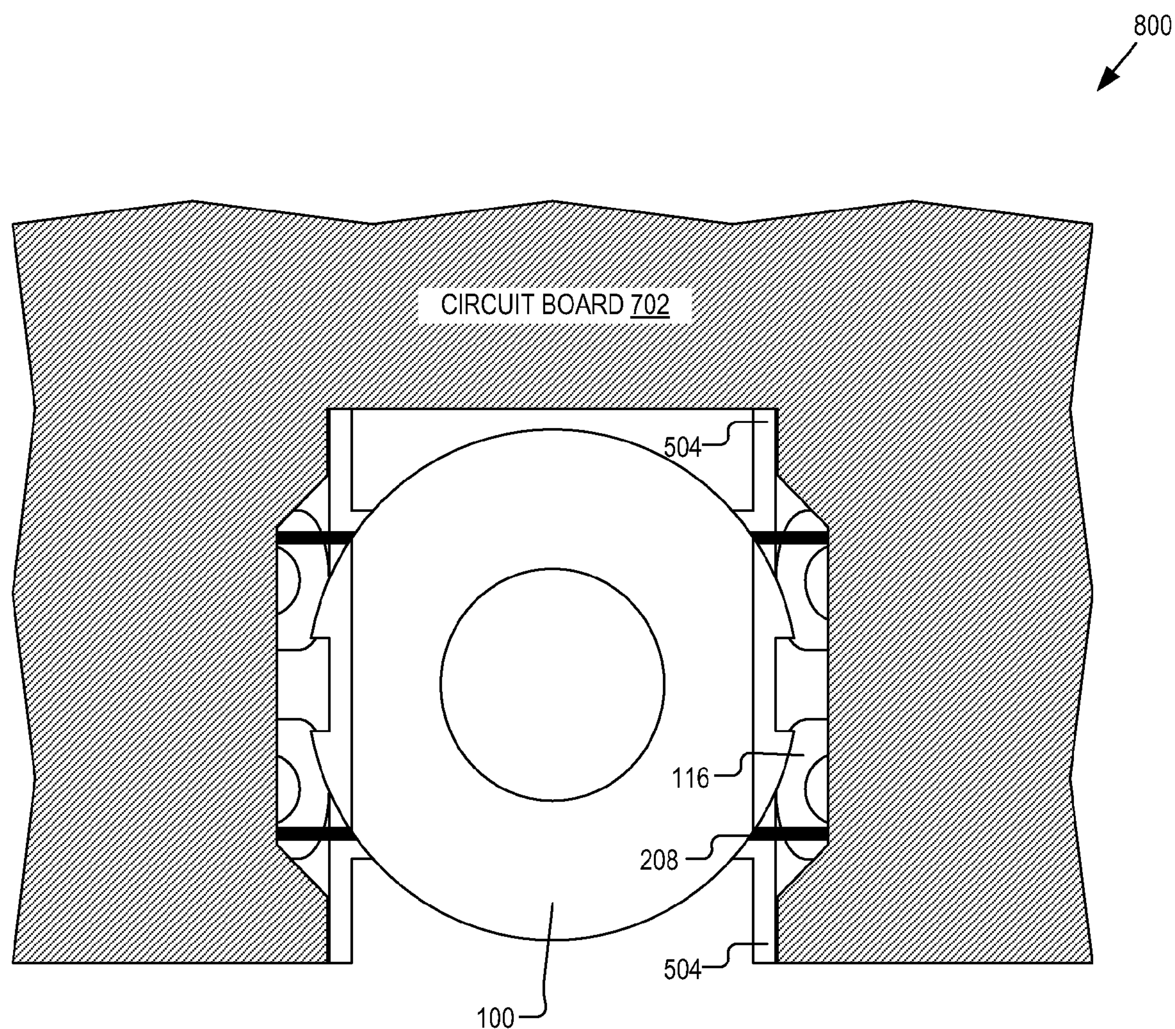
FIG. 9 is a top view illustrating a circuit board assembly including a low profile coil-wound bobbin, in accordance with the teachings of the present invention.

Cutout region 704 is configured to receive a transformer, such as one utilizing the low profile coil-wound bobbin 100 discussed previously. Cutout regions 706 are provided to allow wire ends 208 (see FIG. 1) to pass through from one side of circuit board 702 to another side of circuit board 702 without being damaged by edges of the circuit board. In addition, cutout regions 706 allow inner PCB edges 707 to be flush with vertical member 504 (shown in FIG. 5) so that additional space on PCB 702 may be utilized for other purposes. Furthermore, cutout regions 706 are configured to allow wire ends 208 to enter grooves 116 so that they are recessed into terminal base member 108. For example, FIG. 9 is a top view illustrating a circuit board assembly 800 including low profile coil-wound bobbin 100, in accordance with the teachings of the present invention. As can be seen from FIG. 9, cutout region 704 allows low profile coil-wound bobbin 100 to be mounted on one side of circuit board 702 and to also extend through to another side of circuit board 702. Also shown in FIG. 9 are cutout regions 706 that allow wire ends 208 to pass from one side of circuit board 702 to another side of the circuit board and to enter grooves 116 for routing to an appropriate terminal. In addition, FIG. 9 illustrates that cutout regions 706 allow PCB edges 707 to be flush with vertical member 504. Although FIGS. 7-9 illustrate circuit board 702 as including cutout regions 704/706 towards the edge of the circuit board, cutout regions 704/706 may, in one embodiment, be located in an interior region of the circuit board such that the circuit board completely surrounds the low profile coil-wound bobbin on all four sides.

Figure 10:
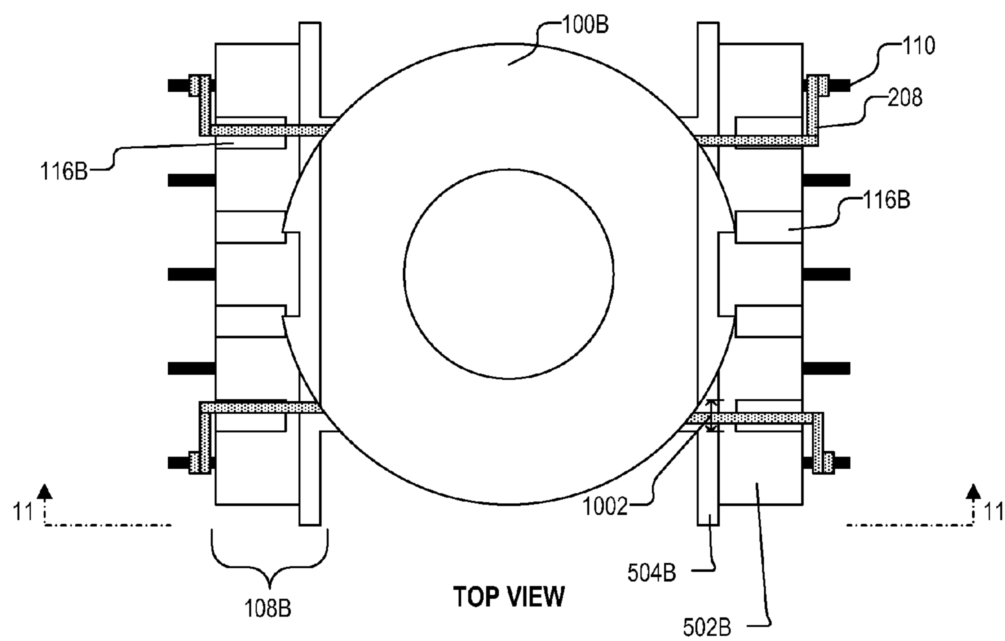
FIG. 10 is a top view illustrating a low profile coil-wound bobbin, in accordance with the teachings of the present invention.

FIG. 10 is a top view illustrating a low profile coil-wound bobbin 100B, in accordance with the teachings of the present invention. The illustrated example of coil-wound bobbin 100B includes grooves 116B. Grooves 116B are configured to allow wire ends 208 to be recessed into terminal base member 108B. Thus, when low profile coil-wound bobbin 100B is mounted to a circuit board, wire ends 208 may be routed between the circuit board and low profile coil-wound bobbin 100B such that wire ends 208 are recessed within terminal base member 108B. In the illustrated example, grooves 116B extend from a terminal side of horizontal member 502B to an area short of vertical member 504B. That is, grooves 116B may not extend the full width of horizontal member 502B. Further illustrated in the example of FIG. 10 are chamfer regions 1002. Chamfer regions 1002 may be provided on a top edge of vertical member 504B for each of grooves 116B. In one example, chamfer regions 1002 are substantially aligned with their respective groove 116B.

Figure 11:
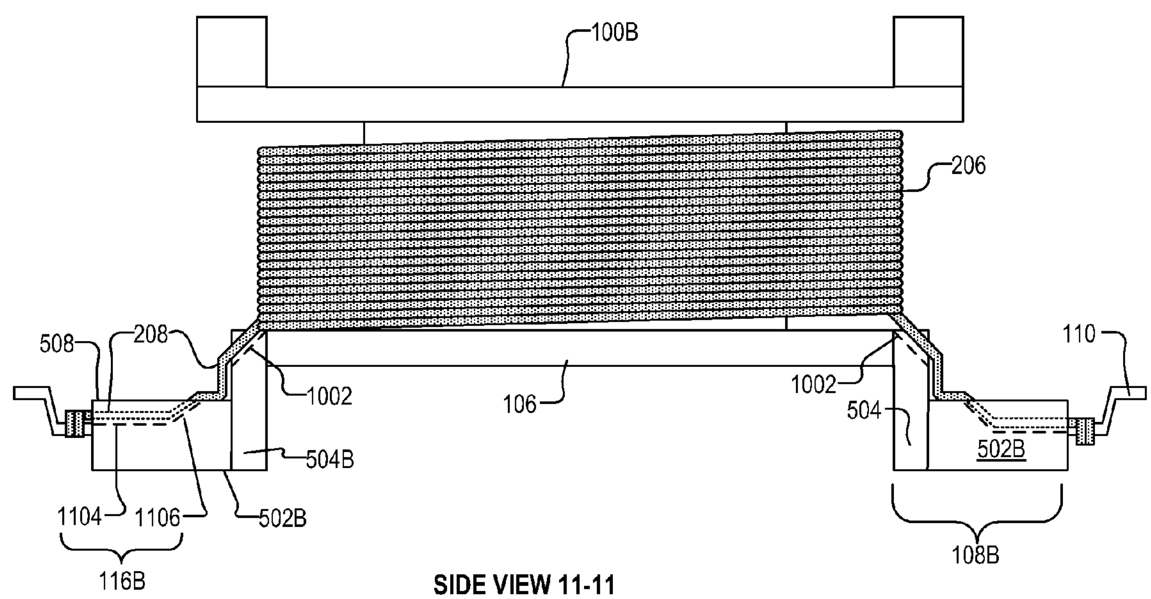
FIG. 11 is a side view illustrating the low profile coil-wound bobbin taken substantially along section lines 11-11 of FIG. 10.

FIG. 11 is a side view illustrating the low profile coil-wound bobbin 100B taken substantially along section lines 11-11 of FIG. 10. As shown in FIG. 11 chamfer regions 1002 are generally sloped to make the bends of wire ends 208 less severe to reduce strain and possible breakage of wire ends 208. Also, chamfer regions 1002 may guide wire ends 208 along their route from coil-wire arrangement 206 to their respective grooves 116B. Also shown in FIG. 11 are grooves 116B as including a horizontal region 1104 and a sloped region 1106. Sloped region 110 may also make the bends of wire ends 208 less severe to reduce strain and possible breakage of wire ends 208 as well as guide wire ends 208 along their route from top surface 508 into grooves 116B.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A low profile bobbin, comprising:

a spool configured to receive a coil-wire arrangement wound around an axis of the spool; and a terminal to be coupled to the coil-wire arrangement and to a first side of a circuit board, wherein the terminal is configured to couple the low profile bobbin to the first side of the circuit board such that the axis of the spool is substantially normal to the circuit board and that the low profile bobbin extends completely through the circuit board to a second side of the circuit board.

2. The low profile bobbin of claim 1, wherein the terminal is a surface mount terminal.

3. The low profile bobbin of claim 1, further comprising:

an upper flange coupled to the spool such that the upper flange is entirely disposed on the second side of the circuit board when the low profile bobbin is mounted to the circuit board; and a lower flange coupled to the spool opposite the upper flange, wherein the upper and lower flanges are configured to at least partially contain the coil-wire arrangement on the spool, and wherein the terminal includes a mounting surface to be coupled to the circuit board.

4. The low profile bobbin of claim 3, wherein the mounting surface generally faces a direction of the upper flange.

5. The low profile bobbin of claim 3, further comprising an opening extending through the upper flange, the spool and the lower flange, wherein the opening is configured to receive a core.

6. The low profile bobbin of claim 3, wherein the upper flange includes at least one core guide extending from a top surface of the upper flange, wherein the at least one core guide is configured to align a top core section with the upper flange.

7. The low profile bobbin of claim 3, further comprising a terminal base member coupled to the lower flange and the plurality of terminals, wherein the terminal base member includes a groove configured to allow a wire end of the coil-wire arrangement to be recessed into the terminal base member.

8. The low profile bobbin of claim 7, wherein the terminal base member includes an inside surface beneath the lower flange, wherein the inside surface is configured to align a bottom core section with the lower flange.

9. The low profile bobbin of claim 7, wherein the terminal is configured to couple the low profile bobbin to the circuit board such that the terminal base member is disposed on the first side of the circuit board and the spool and upper flange are disposed on the second side of the circuit board.

10. The low profile bobbin of claim 3, further comprising:

a top core section coupled to the upper flange;

a bottom core section coupled to the lower flange opposite the top core section; and a core coupled between the top core section and the bottom core section.

11. The low profile bobbin of claim 3, wherein the mounting surface is disposed between an upper surface of the lower flange and a bottom-most surface of the low profile bobbin.

12. The low profile bobbin of claim 1, wherein the spool has a substantially annular cross-section.

13. The low profile bobbin of claim 1, wherein the terminal is a through hole component.

14. A circuit board assembly, comprising:

a circuit board; and a low profile bobbin including:

a spool having an axis;

a coil-wire arrangement wound around the axis of the spool; and a terminal to be coupled to the coil-wire arrangement and to a first side of the circuit board, wherein the terminal is configured to couple the low profile bobbin to the first side of the circuit board such that the axis of the spool is substantially normal to the circuit board and that the low profile bobbin extends completely through the circuit board to a second side of the circuit board.

15. The circuit board assembly of claim 14, wherein the terminal is a surface mount terminal.

16. The circuit board assembly of claim 14, wherein the low profile bobbin further includes:

an upper flange coupled to the spool and entirely disposed on the second side of the circuit board; and a lower flange coupled to the spool opposite the upper flange, wherein the upper and lower flanges are configured to at least partially contain the coil-wire arrangement on the spool, and wherein the terminal includes a mounting surface to be coupled to the circuit board.

17. The circuit board assembly claim 16, wherein the low profile bobbin further includes an opening extending through the upper flange, the spool and the lower flange, wherein the opening is configured to receive the core.

18. The circuit board assembly of claim 16, wherein the upper flange includes at least one core guide extending from a top surface of the upper flange, wherein the at least one core guide is configured to align the top core section with the upper flange.

19. The circuit board assembly of claim 16, wherein the low profile bobbin further includes a terminal base member coupled to the lower flange and the plurality of terminals, wherein the terminal base member is disposed on the first side of the circuit board and includes a groove configured to allow a wire end of the coil-wire arrangement to be recessed into the terminal base member.

20. The circuit board assembly of claim 19, wherein the terminal base member includes an inside surface beneath the lower flange, wherein the inside surface is configured to align the bottom core section with the lower flange.

21. The circuit board assembly of claim 16, wherein the mounting surface is disposed between an upper surface of the lower flange and a bottom-most surface of the low profile bobbin.

22. The circuit board assembly of claim 16, wherein the mounting surface generally faces a direction of the upper flange.

23. The circuit board assembly of claim 14, further comprising a total height of the circuit board assembly that is substantially equal to a bobbin height of the low profile bobbin.

24. A low profile bobbin, comprising:

means for winding a coil-wire arrangement around an axis of the bobbin;

means for electrically and mechanically coupling the low profile bobbin to a first side of a circuit board such that the axis is substantially normal to the circuit board and that the low profile bobbin extends completely through the circuit board to a second side of the circuit board.

25. The low profile bobbin of claim 24, further comprising an upper and lower means for at least partially containing the coil-wire arrangement on the low profile bobbin, wherein the means for electrically and mechanically coupling the low profile bobbin includes a mounting surface to be coupled to the circuit board, wherein the mounting surface is between an upper surface of the lower means and a bottom-most surface of the low profile bobbin.

26. The low profile bobbin of claim 25, further comprising a means for receiving a core.

27. The low profile bobbin of claim 25, further comprising a means for routing wire ends of the coil-wire arrangement between the circuit board and the low profile bobbin such that the wire ends are recessed into the low profile bobbin.

28. The low profile bobbin of claim 25, wherein the mounting surface generally faces a direction of the upper means for containing the coil-wire arrangement.

29. A transformer, comprising:

a low profile bobbin including:

a spool having an axis; and a terminal to be coupled to a first side of a circuit board, wherein the terminal is configured to couple the low profile bobbin to the first side of the circuit board such that the axis of the spool is substantially normal to the circuit board and that the low profile bobbin extends completely through the circuit board to a second side of the circuit board; and a coil-wire arrangement wound around the axis of the spool, wherein the coil-wire arrangement includes a wire-end coupled to the terminal.

30. The transformer of claim 29, wherein the terminal is a surface mount terminal.

31. The transformer of claim 29, further comprising:

an upper flange coupled to the spool such that the upper flange is entirely disposed on the second side of the circuit board when the low profile bobbin is mounted to the circuit board; and a lower flange coupled to the spool opposite the upper flange, wherein the upper and lower flanges are configured to at least partially contain the coil-wire arrangement on the spool, and wherein the terminal includes a mounting surface to be coupled to the circuit board.

32. The transformer of claim 31, wherein the mounting surface generally faces a direction of the upper flange.

33. The transformer of claim 31, further comprising a terminal base member coupled to the lower flange and the plurality of terminals, wherein the terminal base member includes a groove configured to allow a wire end of the coil-wire arrangement to be recessed into the terminal base member.

34. The transformer of claim 33, wherein the terminal is configured to couple the low profile bobbin to the circuit board such that the terminal base member is disposed on the first side of the circuit board and the spool and upper flange are disposed on another side of the circuit board.

35. The transformer of claim 31, further comprising:

a top core section coupled to the upper flange;

a bottom core section coupled to the lower flange opposite the top core section; and a core coupled between the top core section and the bottom core section.

36. The transformer of claim 31, wherein the mounting surface is disposed between an upper surface of the lower flange and a bottom-most surface of the low profile bobbin.

* * * * *